(12) United States Patent
Xiao et al.

(10) Patent No.: US 11,152,490 B2
(45) Date of Patent: Oct. 19, 2021

(54) ARRAY SUBSTRATE AND METHOD FOR MANUFACTURING SAME

(71) Applicant: WUHAN CHINA STAR OPTOELECTRONICS TECHNOLOGY CO., LTD., Hubei (CN)

(72) Inventors: Juncheng Xiao, Hubei (CN); Chao Tian, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 497 days.

(21) Appl. No.: 16/097,891

(22) PCT Filed: Aug. 1, 2018

(86) PCT No.: PCT/CN2018/098048
§ 371 (c)(1),
(2) Date: Oct. 31, 2018

(87) PCT Pub. No.: WO2019/205334
PCT Pub. Date: Oct. 31, 2019

(65) Prior Publication Data
US 2021/0225891 A1    Jul. 22, 2021

(30) Foreign Application Priority Data

Apr. 28, 2018  (CN) .......................... 201810404403.0

(51) Int. Cl.
*H01L 29/00* (2006.01)
*H01L 29/66* (2006.01)
(Continued)

(52) U.S. Cl.
CPC .................. *H01L 29/66757* (2013.01); *H01L 21/823462* (2013.01); *H01L 21/823475* (2013.01);
(Continued)

(58) Field of Classification Search
None
See application file for complete search history.

(56) References Cited

U.S. PATENT DOCUMENTS

2008/0297709 A1* 12/2008 Eguchi .............. G02F 1/134363
349/139
2016/0351595 A1   12/2016 Dai
(Continued)

FOREIGN PATENT DOCUMENTS

CN   104617102 A   5/2015
CN   105552027 A   5/2016
(Continued)

*Primary Examiner* — Reema Patel

(57) ABSTRACT

The present disclosure provides an array substrate and a method for manufacturing the same. The method includes providing a substrate, and forming a polysilicon layer, a gate insulating layer, a second buffer layer, a patterned second metal layer, and a third buffer layer on the substrate in turn; forming a through-hole by a mask process, wherein the through-hole passes through the passivation layer, the third buffer layer, the second buffer layer, and the gate insulating layer to contact the polysilicon layer.

13 Claims, 4 Drawing Sheets

(51) Int. Cl.
*H01L 21/8234* (2006.01)
*H01L 27/12* (2006.01)
*H01L 29/786* (2006.01)

(52) U.S. Cl.
CPC .... *H01L 27/1288* (2013.01); *H01L 29/78672* (2013.01); *H01L 29/78675* (2013.01)

(56) References Cited

U.S. PATENT DOCUMENTS

| | | |
|---|---|---|
| 2018/0286893 A1 | 10/2018 | Liu |
| 2018/0366498 A1 | 12/2018 | Deng |
| 2019/0064568 A1 | 2/2019 | Zheng et al. |

FOREIGN PATENT DOCUMENTS

| | | |
|---|---|---|
| CN | 105702623 A | 6/2016 |
| CN | 106847743 A | 6/2017 |
| CN | 107479284 A | 12/2017 |

* cited by examiner

ARRAY SUBSTRATE AND METHOD FOR MANUFACTURING SAME

FIELD OF INVENTION

The present disclosure relates to the field of display technology, and more particularly to an array substrate and a method for manufacturing the same.

BACKGROUND

Low temperature polysilicon (LTPS) has advantage of high electron mobility, which facilitates effective reduction of area occupied by thin film transistor (TFT), and thus increases aperture ratio of display panels. Brightness of display panels is increased, while power consumption of panels is reduced. This is helpful in decreasing the manufacturing costs of panels as well. Therefore, LTPS and method for manufacturing the same have become one of the mainstream techniques used for field of liquid crystal display.

However, conventional methods for manufacturing LTPS is complicated. There are as many as ten film layers formed on an array substrate. Many mask processes are required to form these films. This not only prolongs display panel manufacturing time, but also results in high manufacturing cost, high raw material cost, and high operation cost for formation thereof.

For this reason, panel manufacturers endeavor to shorten array substrate manufacturing periods, increase product manufacturing yields, increase product manufacturing efficiency, and decrease product manufacturing costs in order to advantageously compete against other opponents. Therefore, there is a need to provide an LTPS type array substrate and a method for manufacturing the same, which reduces a number of mask processes.

SUMMARY OF DISCLOSURE

The present disclosure provides an array substrate and a method for manufacturing the same, which solve the problems encountered by the prior art where many mask processes are required to manufacture an array substrate such that a method for manufacturing an array substrate is complicated and the manufacturing cost of an array substrate is high.

To achieve the above described objective, the present disclosure provides some technical schemes as follows.

In a first aspect, the present disclosure provides a method for manufacturing an array substrate, comprising:

a step S10 of providing a substrate, and forming a light-shielding layer, a first buffer layer, and a polysilicon layer on the substrate in turn;

a step S20 of forming a gate insulating layer and a patterned first metal on a surface of the polysilicon layer in turn, and performing an ion implantation on the polysilicon layer to form a source/drain doped area at two opposite ends of the polysilicon layer and a channel area in the middle thereof;

a step S30 of forming a second buffer layer, a patterned second metal, a third buffer layer, a patterned first transparent electrode, and a passivation layer on the gate insulating layer in turn;

a step S40 of forming a through-hole by a mask process, wherein the through-hole passes through the passivation layer, the third buffer layer, the second buffer layer, and the gate insulating layer to contact the polysilicon layer; and a step S50 of forming a patterned second transparent electrode on a surface of the passivation layer, wherein the second transparent electrode covers a surface of the through-hole and is electrically connected to the second metal;

wherein a pixel electrode is electrically connected to the passivation layer, the third buffer layer, the second metal, the second buffer layer, the gate insulating layer, and the polysilicon layer via the through-hole.

In accordance with one preferred embodiment of the present disclosure, all of the passivation layer, the third buffer layer, the second buffer layer, and the gate insulating layer are made of a material including at least one of silicon nitride and silicon oxide.

In accordance with one preferred embodiment of the present disclosure, the first metal is a gate electrode, and the second metal is a source/drain electrode.

In accordance with one preferred embodiment of the present disclosure, the first transparent electrode is a common electrode, and the second transparent electrode is a pixel electrode.

In a second aspect, the present disclosure provides an array substrate, comprising:

a substrate;

a light-shielding layer disposed on the substrate;

a first buffer layer disposed on the substrate and covering the substrate;

a polysilicon layer disposed on the first buffer layer;

a gate insulating layer disposed on the polysilicon layer;

a first metal disposed on the gate insulating layer to correspond to the polysilicon layer;

a second buffer layer disposed on the gate insulating layer and covering the first metal;

a second metal disposed on the second buffer layer;

a third buffer layer disposed on the second buffer layer to cover the second metal;

a first transparent electrode disposed on the third buffer layer;

a passivation layer disposed on the third buffer layer and covering the first transparent electrode;

a second transparent electrode disposed on the passivation layer; and a through-hole passing through the passivation layer, the third buffer layer, the second buffer layer, and the gate insulating layer to contact the polysilicon layer;

wherein the second transparent electrode covers a surface of the through-hole and is electrically connected to the second metal.

In accordance with one preferred embodiment of the present disclosure, all of the passivation layer, the third buffer layer, the second buffer layer, and the gate insulating layer are made of a material including at least one of silicon nitride and silicon oxide.

In accordance with one preferred embodiment of the present disclosure, the first metal is a gate electrode, and the second metal is a source/drain electrode.

In accordance with one preferred embodiment of the present disclosure, the first transparent electrode is a common electrode, and the second transparent electrode is a pixel electrode.

In accordance with one preferred embodiment of the present disclosure, the pixel electrode is electrically connected to the passivation layer, the third buffer layer, the second metal, the second buffer layer, the gate insulating layer, and the polysilicon layer via the through-hole.

In a third aspect, the present disclosure provides a method for manufacturing an array substrate, comprising:

a step S10 of providing a substrate, and forming a light-shielding layer, a first buffer layer, and a polysilicon layer on the substrate in turn;

a step S20 of forming a gate insulating layer and a patterned first metal on a surface of the polysilicon layer in turn, and performing an ion implantation on the polysilicon layer to form a source/drain doped area at two opposite ends of the polysilicon layer and a channel area in the middle thereof;

a step S30 of forming a second buffer layer, a patterned second metal, a third buffer layer, a patterned first transparent electrode, and a passivation layer on the gate insulating layer in turn;

a step S40 of forming a through-hole by a mask process, wherein the through-hole passes through the passivation layer, the third buffer layer, the second buffer layer, and the gate insulating layer to contact the polysilicon layer; and a step S50 of forming a patterned second transparent electrode on a surface of the passivation layer, wherein the second transparent electrode covers a surface of the through-hole and is electrically connected to the second metal.

In accordance with one preferred embodiment of the present disclosure, all of the passivation layer, the third buffer layer, the second buffer layer, and the gate insulating layer are made of a material including at least one of silicon nitride and silicon oxide.

In accordance with one preferred embodiment of the present disclosure, the first metal is a gate electrode, and the second metal is a source/drain electrode.

In accordance with one preferred embodiment of the present disclosure, the first transparent electrode is a common electrode, and the second transparent electrode is a pixel electrode.

The present disclosure provides an array substrate and a method for manufacturing the same. There is only one through-hole formed to achieve effective electrical connection among the gate insulating layer, the second buffer layer, the third buffer layer, and the passivation layer. Four mask processes as used in the prior art are thus replaced by a single one mask process as used in the present disclosure. In the method for manufacturing an array substrate according to the present disclosure, the manufacturing process of an array substrate is simplified and the manufacturing cost of an array substrate is reduced.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
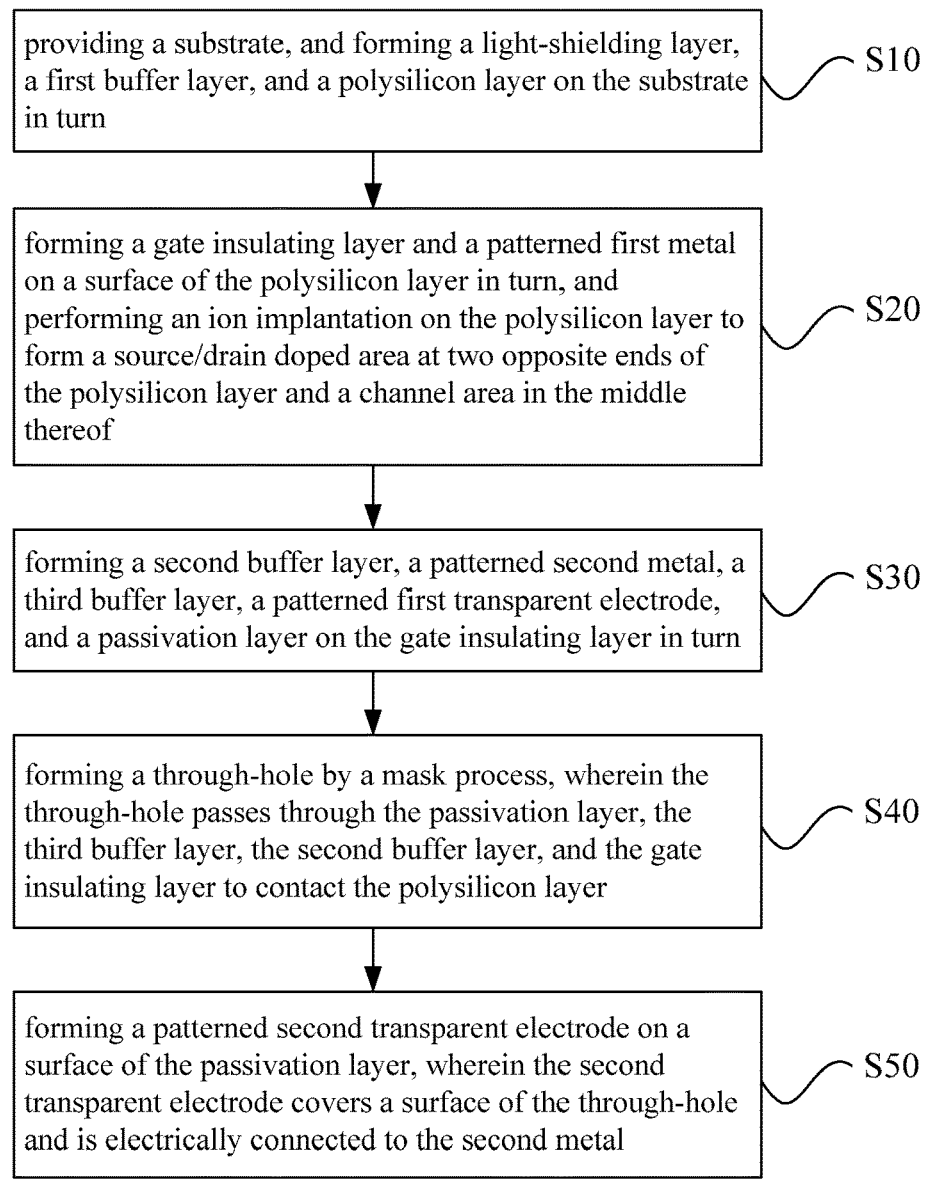
FIG. 1 is a schematic diagram showing a flow chart of a method for manufacturing an LTPS type array substrate according to one embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure provides an array substrate and a method for manufacturing the same, which solve the problems encountered by the prior art where many mask processes are required to manufacture an array substrate such that a method for manufacturing an array substrate is complicated and the manufacturing cost of an array substrate is high.

Preferred embodiments of the present disclosure in conjunction with drawings are provided below to facilitate understanding of subject invention.

FIG. 1 is a schematic diagram showing a flow chart of a method for manufacturing an LTPS type array substrate according to one embodiment of the present disclosure. FIGS. 2a-2e illustrate a process flow of a method for manufacturing an LTPS type array substrate according to one embodiment of the present disclosure.

As shown in FIG. 1, the present disclosure provides a method for manufacturing an array substrate. The method includes the following steps.

Figure 2A:
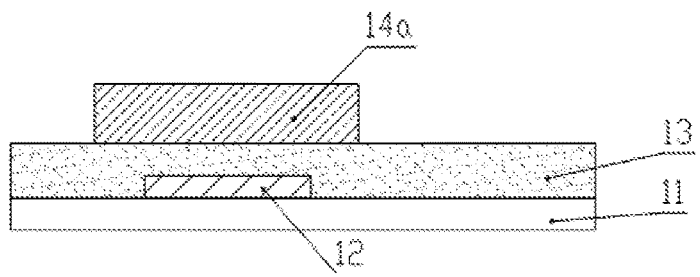
FIGS. 2A, 2B, 2C, 2D, and 2E illustrate a process flow of a method for manufacturing an LTPS type array substrate according to one embodiment of the present disclosure.

In a step S10 (as shown in FIG. 2A), a substrate 11 is provided, and a light-shielding layer 12, a first buffer layer 13, and a polysilicon layer 14a are formed on the substrate 11 in turn.

The substrate 11 is a glass substrate, and is generally configured as a rigid base of the array substrate. Before formation of LTPS on the glass substrate, the glass substrate has to be cleaned.

Preferably, the light-shielding layer 12 is made of a non-transparent material, such as a metal or an inorganic material. In some cases, the light-shielding layer 12 is omitted. The first buffer layer 13 is formed on the substrate 11 to cover the light-shielding layer 12. The first buffer layer 13 is made of a material including at least one of silicon nitride and silicon oxide. The first buffer layer 13 is configured to block external particles from polluting LTPS device, and serves a buffer.

Generally, two mask processes are required to perform the step S10. The first mask process is used to form the light-shielding layer 12, and the second mask process is used to form the polysilicon layer 14a.

Figure 2B:
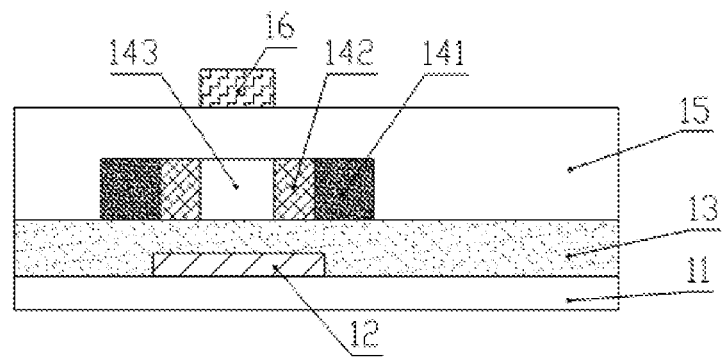

In a step S20 (as shown in FIG. 2B), a gate insulating layer 15 and a patterned first metal 16 are formed on a surface of the polysilicon layer 14a in turn, and an ion implantation is performed on the polysilicon layer 14a to form a source/drain doped area (including a source/drain lightly doped area 142 and a source/drain heavily doped area 141) at two opposite ends of the polysilicon layer and a channel area 143 in the middle thereof.

Specifically, a first metal layer is formed on the gate insulating layer 15, and a first etching process is performed on the polysilicon layer 14a and the first metal layer to form the source/drain heavily doped area 141 and an initially patterned first metal. Then, a second etching process is performed on the polysilicon layer 14a and the initially patterned first metal to form the source/drain lightly doped area 142 and the first metal 16. Both of the first etching process and the second etching process are carried out in a third mask process.

Preferably, the first metal 16 is a gate electrode. The gate insulating layer 15 is formed on the first buffer layer 13 to cover the polysilicon layer 14. The gate insulating layer 15 is made of a material including at least one of silicon nitride and silicon oxide.

Figure 2C:
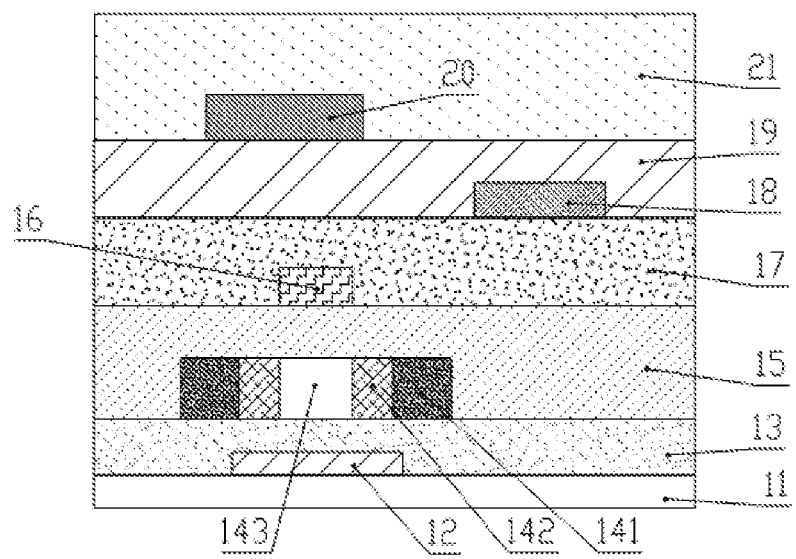

In a step S30 (as shown in FIG. 2C), a second buffer layer 17, a patterned second metal 18, a third buffer layer 19, a patterned first transparent electrode 20, and a passivation layer 21 are formed on the gate insulating layer 15 in turn.

Specifically, in the step S30, a second buffer layer 17 is formed on the gate insulating layer 15. Next, a second metal layer is formed on the second buffer layer 17. Then a fourth mask process is used to pattern the second metal layer to form the second metal 18.

Preferably, the second metal 18 is a source/drain electrode.

All of the second buffer layer 17, the third buffer layer 19, and the passivation layer 21 are made of similar materials, which include at least one of silicon nitride and silicon oxide. It is understood that the second buffer layer 17, the third buffer layer 19, and the passivation layer 21 could be made of other similar inorganic materials.

In the step S30, a fifth mask process is used to form the first transparent electrode 20.

Figure 2D:
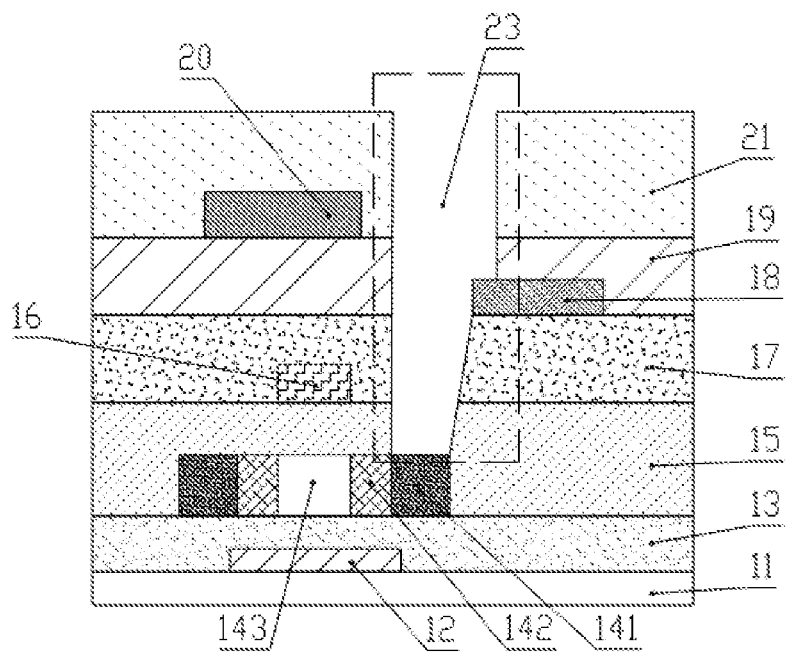

In a step S40 (as shown in FIG. 2D), a through-hole 23 is formed by a mask process, wherein the through-hole 23 passes through the passivation layer 21, the third buffer layer 19, the second buffer layer 17, and the gate insulating layer 15 to contact the polysilicon layer 14.

Specifically, the through-hole 23 is connected to the source/drain heavily doped area 141 of the polysilicon layer 14.

According to the present disclosure, the mask process used to from the through-hole 23 is a sixth mask process. Compared to the prior art where four mask processes are required to respectively form a through-hole in the passivation layer, a through-hole in the third buffer layer, a through-hole in the second buffer layer, and a through-hole in the gate insulating layer, the present disclosure is characterized in that only one mask process (i.e, the sixth mask process) is required to form the through-hole 23. Since the passivation layer 21, the third buffer layer 19, the second buffer layer 17, and the gate insulating layer 15 are made of the same material or have similar chemical properties, only one mask process (i.e, the sixth mask process) is used to perform etching on these layers to form the through-hole 23. Four mask processes as used in the prior art are replaced by a single one mask process as used in the present disclosure, therefore the method for manufacturing an array substrate is significantly simplified.

Figure 2E:
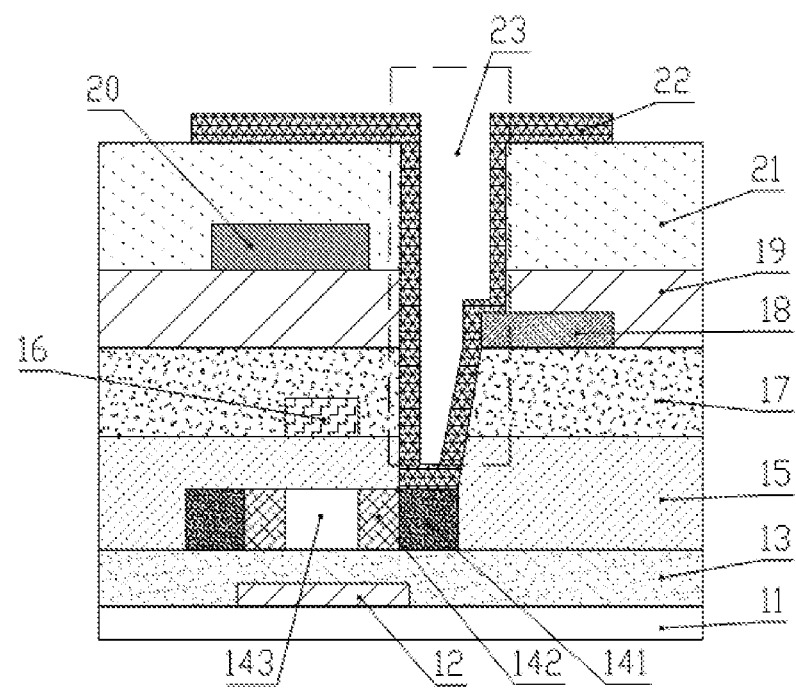

In a step S50 (as shown in FIG. 2E), a patterned second transparent electrode 22 is formed on a surface of the passivation layer 21, wherein the second transparent electrode 22 covers a surface of the through-hole 23 and is electrically connected to the second metal 18.

Specifically, in the step S50, a second transparent electrode layer is formed on a surface of the passivation layer 21. Then, a seventh mask process is used to pattern the second transparent electrode layer to form the second transparent electrode 22.

The second transparent electrode 22 covers a surface of the through-hole 23. The second transparent electrode 22 is electrically connected to the passivation layer 21, the third buffer layer 19, the second metal 18, the second buffer layer 17, the gate insulating layer 15, and the polysilicon layer 14 via the through-hole 23.

Preferably, the first transparent electrode 20 is a common electrode, and the second transparent electrode 22 is a pixel electrode.

Figure 3:
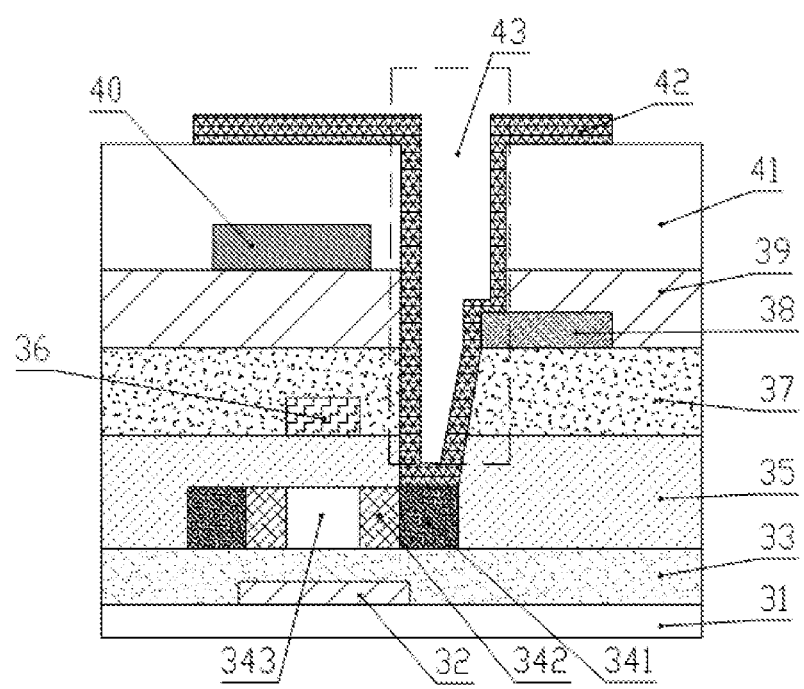
FIG. 3 shows a structure of an array substrate according to one embodiment of the present disclosure.

As shown in FIG. 3, in another aspect of the present disclosure, the present disclosure additionally provides an array substrate, comprising:

a substrate 31;

a light-shielding layer 32 disposed on the substrate 31;

a first buffer layer 33 disposed on the substrate 31 and covering the light-shielding layer 32;

a polysilicon layer 34 disposed on the first buffer layer 33;

a gate insulating layer 35 disposed on the polysilicon layer 34;

a first metal 36 disposed on the gate insulating layer 35 to correspond to the polysilicon layer 34;

a second buffer layer 37 disposed on the gate insulating layer 35 and covering the first metal 36;

a second metal 38 disposed on the second buffer layer 37;

a third buffer layer 39 disposed on the second buffer layer 37 to cover the second metal 38;

a first transparent electrode 40 disposed on the third buffer layer 39;

a passivation layer 41 disposed on the third buffer layer 39 and covering the first transparent electrode 40;

a second transparent electrode 42 disposed on the passivation layer 41; and a through-hole 23 passing through the passivation layer 41, the third buffer layer 39, the second buffer layer 37, and the gate insulating layer 35 to contact the polysilicon layer 34;

wherein the second transparent electrode 42 covers a surface of the through-hole 23 and is electrically connected to the second metal 38.

Preferably, all of the passivation layer 41, the third buffer layer 39, the second buffer layer 37, and the gate insulating layer 35 are made of a material including at least one of silicon nitride and silicon oxide.

Preferably, the first metal 36 is a gate electrode, and the second metal 38 is a source/drain electrode.

Preferably, the first transparent electrode 40 is a common electrode, and the second transparent electrode 42 is a pixel electrode.

Preferably, the pixel electrode 42 is electrically connected to the passivation layer 41, the third buffer layer 39, the second metal 38, the second buffer layer 37, the gate insulating layer 35, and the polysilicon layer 34 via the through-hole 43.

In this embodiment, the second metal 38 is disposed on the second buffer layer 37, and the through-hole 43 passes through the passivation layer 41, the third buffer layer 39, the second buffer layer 37, and the gate insulating layer 35. Therefore, only one through-hole is required to achieve electrical connection among these layers. Such a structure provides a base for reducing the number of mask processes used in the method for manufacturing an array substrate.

Since the array substrate in this embodiment works in the same way as the array substrate as described in the above embodiment, working principle thereof is omitted.

The present disclosure provides an array substrate and a method for manufacturing the same. There is only one through-hole formed to achieve effective electrical connection among the gate insulating layer, the second buffer layer, the third buffer layer, and the passivation layer. Four mask processes as used in the prior art are thus replaced by a single one mask process as used in the present disclosure. In the method for manufacturing an array substrate according to the present disclosure, the manufacturing process of an array substrate is simplified and the manufacturing cost of an array substrate is reduced.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing an array substrate, comprising:
   a step S10 of providing a substrate, and forming a light-shielding layer, a first buffer layer, and a polysilicon layer on the substrate in turn;
   a step S20 of forming a gate insulating layer and a patterned first metal on a surface of the polysilicon layer in turn, and performing an ion implantation on the polysilicon layer to form a source/drain doped area at two opposite ends of the polysilicon layer and a channel area in the middle thereof;
   a step S30 of forming a second buffer layer, a patterned second metal, a third buffer layer, a patterned first transparent electrode, and a passivation layer on the gate insulating layer in turn;
   a step S40 of forming a through-hole by a mask process, wherein the through-hole passes through the passivation layer, the third buffer layer, the second buffer layer, and the gate insulating layer to contact the polysilicon layer; and
   a step S50 of forming a patterned second transparent electrode on a surface of the passivation layer, wherein the second transparent electrode covers a surface of the through-hole and is electrically connected to the second metal;
   wherein the patterned second transparent electrode is electrically connected to the passivation layer, the third buffer layer, the second metal, the second buffer layer, the gate insulating layer, and the polysilicon layer via the through-hole.

2. The method for manufacturing the array substrate according to claim 1, wherein all of the passivation layer, the third buffer layer, the second buffer layer, and the gate insulating layer are made of a material including at least one of silicon nitride or silicon oxide.

3. The method for manufacturing the array substrate according to claim 1, wherein the first metal is a gate electrode, and the second metal is a source/drain electrode.

4. The method for manufacturing the array substrate according to claim 1, wherein the first transparent electrode is a common electrode, and the patterned second transparent electrode is a pixel electrode.

5. An array substrate, comprising:
   a substrate;
   a first buffer layer disposed on the substrate and covering the substrate;
   a polysilicon layer disposed on the first buffer layer;
   a gate insulating layer disposed on the polysilicon layer;
   a first metal disposed on the gate insulating layer to correspond to the polysilicon layer;
   a second buffer layer disposed on the gate insulating layer and covering the first metal;
   a second metal disposed on the second buffer layer;
   a third buffer layer disposed on the second buffer layer to cover the second metal;
   a first transparent electrode disposed on the third buffer layer;
   a passivation layer disposed on the third buffer layer and covering the first transparent electrode;
   a second transparent electrode disposed on the passivation layer; and
   a through-hole passing through the passivation layer, the third buffer layer, the second buffer layer, and the gate insulating layer to contact the polysilicon layer;
   wherein the second transparent electrode covers a surface of the through-hole and is electrically connected to the second metal.

6. The array substrate according to claim 5, wherein all of the passivation layer, the third buffer layer, the second buffer layer, and the gate insulating layer are made of a material including at least one of silicon nitride or silicon oxide.

7. The array substrate according to claim 5, wherein the first metal is a gate electrode, and the second metal is a source/drain electrode.

8. The array substrate according to claim 5, wherein the first transparent electrode is a common electrode, and the second transparent electrode is a pixel electrode.

9. The array substrate according to claim 8, wherein the pixel electrode is electrically connected to the passivation layer, the third buffer layer, the second metal, the second buffer layer, the gate insulating layer, and the polysilicon layer via the through-hole.

10. A method for manufacturing an array substrate, comprising:
    a step S10 of providing a substrate, and forming a light-shielding layer, a first buffer layer, and a polysilicon layer on the substrate in turn;
    a step S20 of forming a gate insulating layer and a patterned first metal on a surface of the polysilicon layer in turn, and performing an ion implantation on the polysilicon layer to form a source/drain doped area at two opposite ends of the polysilicon layer and a channel area in the middle thereof;
    a step S30 of forming a second buffer layer, a patterned second metal, a third buffer layer, a patterned first transparent electrode, and a passivation layer on the gate insulating layer in turn;
    a step S40 of forming a through-hole by a mask process, wherein the through-hole passes through the passivation layer, the third buffer layer, the second buffer layer, and the gate insulating layer to contact the polysilicon layer; and
    a step S50 of forming a patterned second transparent electrode on a surface of the passivation layer, wherein the patterned second transparent electrode covers a surface of the through-hole and is electrically connected to the second metal.

11. The method for manufacturing the array substrate according to claim 10, wherein all of the passivation layer, the third buffer layer, the second buffer layer, and the gate insulating layer are made of a material including at least one of silicon nitride or silicon oxide.

12. The method for manufacturing the array substrate according to claim 10, wherein the first metal is a gate electrode, and the second metal is a source/drain electrode.

13. The method for manufacturing the array substrate according to claim 10, wherein the first transparent electrode is a common electrode, and the patterned second transparent electrode is a pixel electrode.

* * * * *